US009966534B2

(12) United States Patent
Stackhouse et al.

(10) Patent No.: US 9,966,534 B2
(45) Date of Patent: May 8, 2018

(54) POLYMER AND DEVICE

(71) Applicants: Cambridge Display Technology Limited, Godmanchester (GB); Sumitomo Chemical Company Limited, Tokyo (JP)

(72) Inventors: Philip Stackhouse, Godmanchester (GB); Sophie Barbara Heidenhain, Traunreut (DE); Ruth Pegington, Godmanchester (GB); Jonathan Pillow, Godmanchester (GB); Martin Humphries, Godmanchester (GB); Tomoyasu Yoshida, Tokyo (JP)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 196 days.

(21) Appl. No.: 14/655,237

(22) PCT Filed: Dec. 23, 2013

(86) PCT No.: PCT/GB2013/053425
§ 371 (c)(1),
(2) Date: Jun. 24, 2015

(87) PCT Pub. No.: WO2014/102543
PCT Pub. Date: Jul. 3, 2014

(65) Prior Publication Data
US 2015/0333262 A1 Nov. 19, 2015

(30) Foreign Application Priority Data
Dec. 24, 2012 (GB) .................. 1223369.8

(51) Int. Cl.
*H01L 51/50* (2006.01)
*H01L 51/00* (2006.01)
(Continued)

(52) U.S. Cl.
CPC .......... *H01L 51/0035* (2013.01); *C08G 61/12* (2013.01); *C08G 73/026* (2013.01);
(Continued)

(58) Field of Classification Search
None
See application file for complete search history.

(56) References Cited

U.S. PATENT DOCUMENTS

2007/0029927 A1  2/2007  Kawamura et al.
2007/0205714 A1* 9/2007  Busing .............. C07C 25/22
                                                          313/504
2008/0102312 A1  5/2008  Parham et al.

FOREIGN PATENT DOCUMENTS

EP          1 645 610 A1   4/2006
JP          2007-162009 A   6/2007
(Continued)

OTHER PUBLICATIONS

Combined Search and Examination Report dated Apr. 26, 2013 for Application No. GB 1223369.8.
(Continued)

*Primary Examiner* — Gregory D Clark
(74) *Attorney, Agent, or Firm* — Wolf, Greenfield & Sacks, P.C.

(57) ABSTRACT

A copolymer comprising a repeat unit of Formula (I) and at least one further repeat unit: Formula (I) wherein: wherein: $Ar^1$ and $Ar^2$ are each independently selected from aryl and heteroaryl, each of which is independently unsubstituted or substituted with one or more substituents; each R is inde-
(Continued)

pendently a substituent; each n is independently 0, 1 or 2; each m is independently 0, 1, 2 or 3, and at least one of the repeat units of the polymer is a partially conjugating repeat unit.

(I)

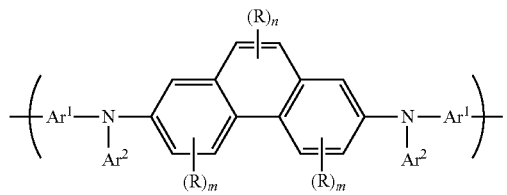

22 Claims, 2 Drawing Sheets

(51) Int. Cl.
    *C08G 73/02*     (2006.01)
    *C08G 61/12*     (2006.01)
    *C09K 11/06*     (2006.01)
    *H01L 51/56*     (2006.01)

(52) U.S. Cl.
    CPC .......... *C09K 11/06* (2013.01); *H01L 51/0043* (2013.01); *C08G 2261/135* (2013.01); *C08G 2261/1414* (2013.01); *C08G 2261/3142* (2013.01); *C08G 2261/3162* (2013.01); *C08G 2261/411* (2013.01); *C08G 2261/512* (2013.01); *C08G 2261/95* (2013.01); *C09K 2211/1433* (2013.01); *H01L 51/0003* (2013.01); *H01L 51/0039* (2013.01); *H01L 51/0085* (2013.01); *H01L 51/5012* (2013.01); *H01L 51/5016* (2013.01); *H01L 51/5056* (2013.01); *H01L 51/56* (2013.01)

(56) References Cited

FOREIGN PATENT DOCUMENTS

| | | |
|---|---|---|
| JP | 2009-263665 A | 11/2009 |
| JP | 2012-028726 A | 2/2012 |
| WO | WO 2005/104263 A1 | 11/2005 |
| WO | WO 2005/104264 A1 | 11/2005 |
| WO | WO 2008/031743 A1 | 3/2008 |
| WO | WO 2009/008351 A1 | 1/2009 |

OTHER PUBLICATIONS

International Search Report and Written Opinion dated Jul. 29, 2014 for Application No. PCT/GB2013/053425.
International Preliminary Report on Patentability dated Jul. 9, 2015 for Application No. PCT/GB2013/053425.
Japanese Office Action for Application No. 2015-548780 dated Nov. 2, 2017.

* cited by examiner

POLYMER AND DEVICE

RELATED APPLICATIONS

The present application is a national stage filing under 35 U.S.C. § 371 of international PCT application, PCT/GB2013/053425, filed Dec. 23, 2013, which claims priority to United Kingdom patent application, GB 1223369.8, filed Dec. 24, 2012, each of which is incorporated herein by reference.

BACKGROUND

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED device may comprise a substrate carrying an anode, a cathode and one or more organic light-emitting layers between the anode and cathode.

Holes are injected into the OLED device through the anode and electrons are injected through the cathode during operation of the device. Holes in the highest occupied molecular orbital (HOMO) and electrons in the lowest unoccupied molecular orbital (LUMO) of a light-emitting material present within the OLED device combine to form an exciton that releases its energy as light. In some devices a hole transporting layer is also provided, which functions to aid hole transport from the anode to the light emitting layer.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

US2007/205714 discloses a copolymer comprising a repeat unit formed from a monomer having the following formula:

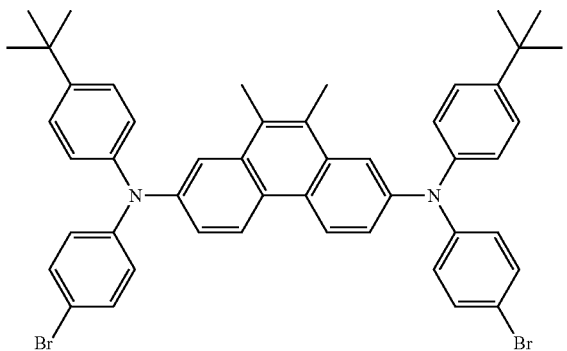

WO 2005/049546 discloses a polymer having the following structural units:

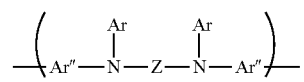

wherein each Ar is independently a substituted or unsubstituted aryl group; each Ar" is a substituted or unsubstituted arylene group; and Z is a polycyclic arylene group.

It is an object of the invention to provide a hole-transporting polymer providing high efficiency whilst maintaining singlet and triplet energy levels which do not quench emission from the light emitting layer.

SUMMARY OF THE INVENTION

In a first aspect the invention provides copolymer comprising a repeat unit of Formula (I) and at least one further repeat unit:

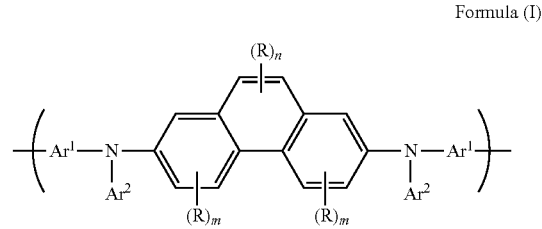

Formula (I)

wherein:

$Ar^1$ and $Ar^2$ are each independently selected from aryl and heteroaryl, each of which is independently unsubstituted or substituted with one or more substituents;

each R is independently a substituent;

each n is independently 0, 1 or 2;

each m is independently 0, 1, 2 or 3, and at least one of the repeat units of the polymer is a partially conjugating repeat unit.

In a second aspect the invention provides a formulation comprising the copolymer of the first aspect and at least one solvent.

In a third aspect the invention provides an organic light-emitting device comprising an anode, a cathode, a light-emitting layer between the anode and the cathode, and a hole transporting layer between the light emitting layer and the anode, wherein the hole transporting layer comprises a copolymer according to the first aspect.

In a fourth aspect the invention provides a method of forming an organic light-emitting device according to the third aspect, the method comprising the steps of: forming the hole-transporting layer over the anode; forming the light-emitting layer over the hole-transporting layer; and forming the cathode over the light-emitting layer.

DESCRIPTION OF FIGURES

The invention will now be described in more detail with reference to the figures in which.

DETAILED DESCRIPTION OF THE INVENTION

Figure 1:
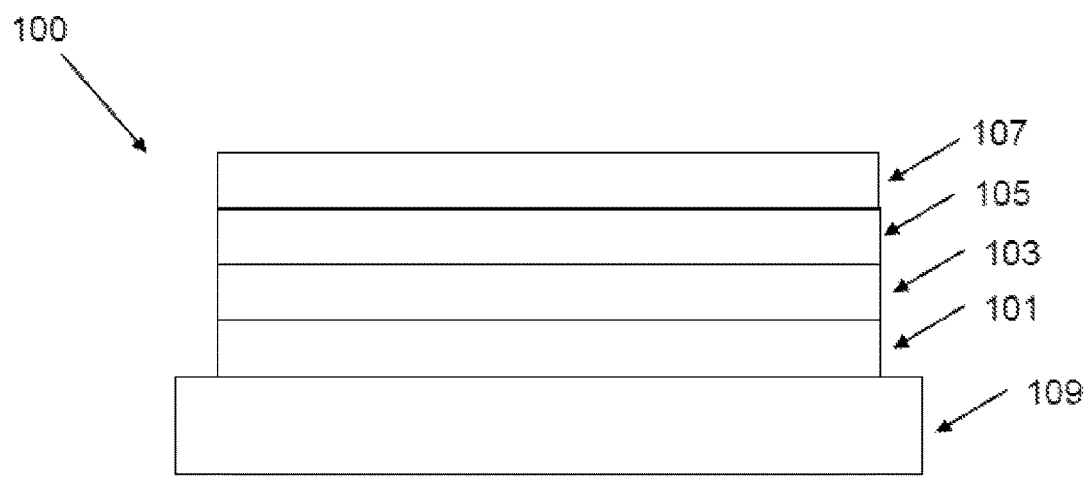
FIG. 1 illustrates an OLED according to an embodiment of the invention.

FIG. 1 illustrates an OLED 100 according to an embodiment of the invention.

The OLED 100 comprises an anode 101, a cathode 107, a light-emitting layer 105 between the anode and the cathode and a hole-transporting layer 103 between the anode 101 and the light-emitting layer 105. The device is supported on a substrate 109, for example glass or plastic.

One or more further layers may be provided between the anode 101 and cathode 107, for example electron transporting layers, hole blocking layers and electron blocking layers. The device may contain more than one light-emitting layer. Preferably, both a hole injection layer and hole-transporting layer are present.

Exemplary device structures include:
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, the light-emitting layer 105 is in contact with the hole-transporting layer 103. The cathode 107 may be in contact with the light-emitting layer 105 or spaced apart therefrom, for example spaced apart by an electron-transporting layer.

Phenanthrene Diamine Repeat Unit

The polymer of the invention comprises a repeat unit of formula (I)

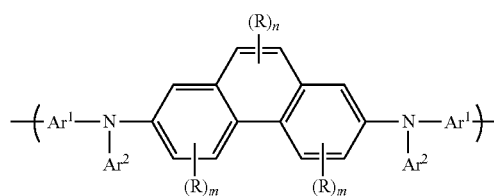

Formula (I)

wherein $Ar^1$ and $Ar^2$, R, n and m are as described above.

Substituents R may be provided to enhance solubility of the polymer; alter the electronic properties of the polymer, e.g. by withdrawal or donation of electrons, or alter the glass transition temperature of the polymer. Substituents R may be crosslinkable groups that may be crosslinked upon formation of a layer containing the copolymer to insolubilise the layer containing the copolymer.

Optionally, n is at least 1, and/or at least one m is 1. In one optional arrangement, n=2 and each m=0.

Exemplary substituents R may be selected from:
$C_{1-20}$ alkyl wherein one or more non-adjacent C atoms may be replaced with O, S, $R^{11}$, C=O and COO, wherein $R^{11}$ is a substituent;
aryl or heteroaryl that may be unsubstituted or substituted with one or more substituents;
a branched or linear chain of aryl or heteroaryl groups wherein each aryl or heteroaryl is independently unsubstituted or substituted with one or more substituents; and
a crosslinkable-group, for example a group comprising a double bond such and a vinyl or acrylate group, or a benzocyclobutene group.

Aryl or heteroaryl substituents R are optionally phenyl. An exemplary linear chain of phenyl groups are biphenyl and terphenyl. An exemplary branched chain of phenyl groups is 3,5-diphenylbenzene.

In the case where R contains one or more aryl or heteroaryl groups, optional substituents of the aryl or heteroaryl groups may be selected from $C_{1-20}$ alkyl wherein one or more non-adjacent C atoms may be replaced with O, S, $NR^{11}$, C=O and COO, wherein $R^{11}$ is a substituent. Exemplary substituents $R^{11}$ include $C_{1-20}$ alkyl.

Optionally, each R is independently a $C_{1-40}$ hydrocarbyl group, for example $C_{1-20}$ alkyl, phenyl that may be unsubstituted or substituted with one or more $C_{1-20}$ alkyl groups; and a branched or linear chain of phenyl groups that may be unsubstituted or substituted with one or more $C_{1-20}$ alkyl groups.

Optionally, $Ar^1$ and $Ar^2$ are each phenyl. Optionally, the repeat unit of formula (I) has formula (II):

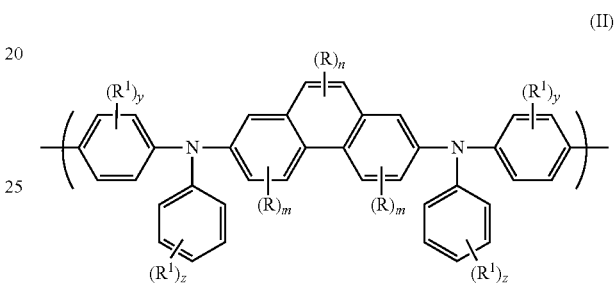

wherein $R^1$ in each occurrence is a substituent; each y is independently 0, 1, 2, 3 or 4; and each z is independently 0, 1, 2, 3, 4 or 5.

Optionally, each y is 0.

Optionally, each z is independently 0, 1, 2 or 3.

One or both $Ar^2$ groups may be a polycyclic aromatic or heteroaromatic group. Extended conjugation provided by such a polycyclic group may increase stability of the repeat unit as compared to a repeat unit having monocyclic group $Ar^2$. Optionally, one or both groups $Ar^2$ is fluorene. In this case, the repeat unit of formula (I) may have formula (XIII):

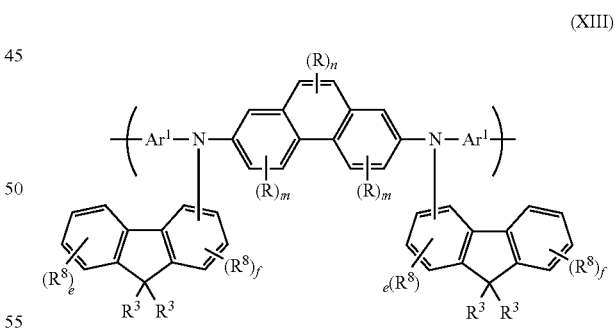

wherein $Ar^1$, R, m and n are as described above; $R^3$ in each occurrence is the same or different and is a substituent; $R^8$ in each occurrence is the same or different and is a substituent; e is 0, 1, 2 or 3; and f is 0, 1, 2, 3 or 4.

Optionally, $Ar^1$ of formula (XIII) is phenyl that may be unsubstituted or substituted with one or more substituents $R^1$.

Exemplary substituents $R^3$ and $R^8$ may be selected from substituents as described with reference to formula (VII).

The fluorene groups $Ar^2$ of the repeat unit of formula (XIII) may each independently be linked to N through any position. In a preferred embodiment one or both fluorene groups $Ar^2$ are linked through their 2-positions.

Exemplary substituents $R^1$ of any repeat unit described herein may be selected from $C_{1-20}$ alkyl wherein one or more non-adjacent C atoms may be replaced with O, S, $NR^{11}$, C=O and COO, wherein $R^{11}$ is a substituent;

aryl or heteroaryl that may be unsubstituted or substituted with one or more substituents; and a branched or linear chain of aryl or heteroaryl groups wherein each aryl or heteroaryl is independently unsubstituted or substituted with one or more substituents.

Optionally, each $R^1$, where present, is independently a $C_{1-40}$ hydrocarbyl group, optionally a $C_{1-20}$ alkyl group.

The repeat unit of formula (I) may be a partially conjugating repeat unit, in which case the one or more further repeat units may or may not comprise one or more partially conjugating repeat units.

An exemplary partially-conjugating repeat unit of formula (I) has formula (XIV):

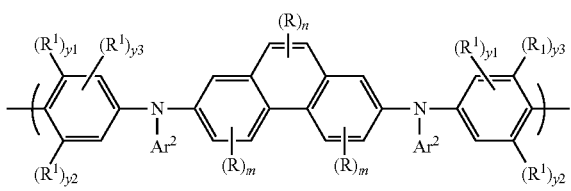

(XIV)

wherein R, $R^1$, $Ar^2$, n and m are as described above; y1 and y2 are each independently 0 or 1 with the proviso that at least one of y1 and y2 is 1; and each y3 is independently 0, 1 or 2.

Repeat units of formula (I) are suitably bound directly to an aromatic or heteroaromatic group of an adjacent co-repeat unit. The presence of a substituent $R^1$ adjacent to a linking position of the repeat unit of formula (XIV) creates a twist between the phenyl group that the group R1 is bound to and the aryl or heteroaryl group of the adjacent co-repeat unit that the phenyl group is bound to, resulting in a twist between the two repeat units that limits the extent of conjugation between the two repeat units.

The repeat unit of formula (I) may form 0.5-75 mol % of repeat units of the copolymer of the invention, optionally 1-50 mol %, optionally 1-40 mol %.

In the device of FIG. 1, the polymer of the invention is provided in a hole-transporting layer of an OLED. In other arrangements, the polymer of the invention may be provided as a light-emitting material of a light-emitting layer or a hole-transporting material provided in a light-emitting layer in combination with a separate light-emitting material.

The polystyrene-equivalent number-average molecular weight (Mn) measured by gel permeation chromatography of the polymers described herein may be in the range of about $1 \times 10^3$ to $1 \times 10^8$, and preferably $1 \times 10^4$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are suitably amorphous polymers.

Co-Repeat Units

The polymer of the invention contains repeat units of formula (I) and at least one co-repeat unit. The co-repeat units may be selected from partially conjugating co-repeat units and fully conjugating co-repeat units. Co-repeat units may contain aromatic or heteroaromatic groups that are directly linked to $Ar^1$ of repeat units of the invention, or to aromatic or heteroaromatic groups of other co-repeat units.

The partially conjugating co-repeat unit of the copolymer of the invention may be a repeat unit that is conjugated to adjacent repeat units, but wherein the extent of conjugation of the repeat unit is limited.

The partially conjugating repeat unit may be a repeat unit having one or more substituents such that the partially conjugated repeat unit is twisted out of the plane of the adjacent repeat unit, or such that the partially conjugating repeat unit contains an internal twist.

By providing a twist along the polymer backbone, the extent of p-orbital overlap between aromatic or heteroaromatic groups along the backbone is limited.

The partially conjugating repeat unit may be a 1,3-linked or 1,2-linked phenylene repeat unit. It will be understood that the extent of conjugation between adjacent aromatic or heteroaromatic repeat units on either side of a 1,3- or 1,2-linked phenylene repeat unit will be less than the extent of conjugation provided by a 1,4-linked phenylene repeat unit.

Optionally, the partially conjugating repeat unit is a repeat unit of formula (IIIa), (IIIb) or (IIIc):

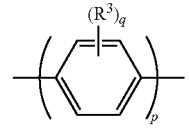

(IIIa)

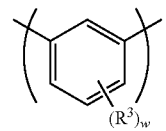

(IIIb)

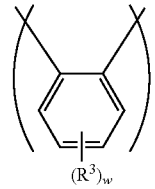

(IIIc)

wherein p is 1, 2 or 3; q in each occurrence is independently 1, 2, 3 or 4; w is 0, 1, 2, 3 or 4; and $R^3$ independently in each occurrence is a substituent.

Where present, each $R^3$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or COO, and one or more H atoms may be replaced with F;

aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula $—(Ar^3)_r$ wherein each $Ar^3$ is independently an aryl or heteroaryl group and r is at least 2, preferably a branched or linear chain of phenyl groups each of which may be unsubstituted or substituted with one or more $C_{1-20}$ alkyl groups; and a crosslinkable-group, for example a group comprising a double bond such and a vinyl or acrylate group, or a benzocyclobutene group.

In the case where $R^3$ comprises an aryl or heteroaryl group, or a linear or branched chain of aryl or heteroaryl groups, the or each aryl or heteroaryl group may be substituted with one or more substituents $R^7$ selected from the group consisting of: alkyl, for example $C_{1-20}$ alkyl, wherein one or more non-adjacent C atoms may be replaced with O, S, substituted N, C=O and —COO— and one or more H atoms of the alkyl group may be replaced with F; fluorine; nitro and cyano;

Substituted N, where present, may be —NR$^9$— wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Crosslinkable groups may be directly bound to the repeat unit or may be spaced apart therefrom by a spacer group, for example a $C_{1-20}$ alkyl groups wherein one or more non-adjacent C atoms of the $C_{1-20}$ alkyl group may be replaced with O, S, C=O or COO.

Preferably, each $R^3$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

A particularly preferred repeat unit of formula (IIIa) has the following formula:

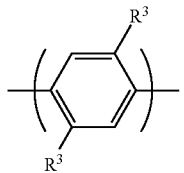

Substituents $R^3$ of the above formula are adjacent to linking positions of the repeat unit, which may cause steric hindrance between the repeat unit and adjacent repeat units, resulting in the repeat unit twisting out of plane relative to one or both adjacent repeat units.

Exemplary repeat units where p is 2 or 3 include the following:

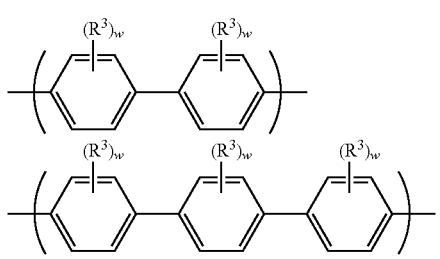

An exemplary repeat unit has the following formula:

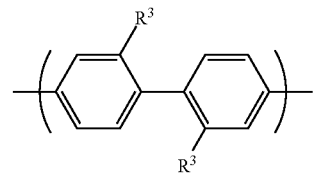

The two $R^3$ groups of the above formula may cause steric hindrance between the phenyl rings they are bound to, resulting in twisting of the two phenyl rings relative to one another to create an internal twist within the repeat unit.

Without wishing to be bound by any theory, it is believed that the presence of a partially conjugating repeat unit allows for conductivity along the polymer backbone without allowing for a high degree of conjugation that may cause quenching or red-shifting of light emitted from the light-emitting layer.

A further class of co-repeat units is optionally substituted fluorene repeat units, such as repeat units of formula (VII):

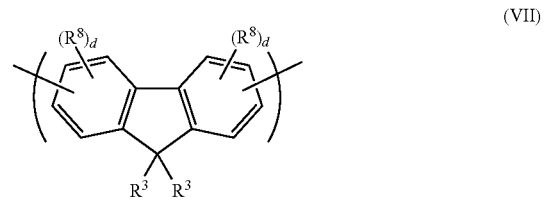

(VII)

wherein $R^3$ in each occurrence is the same or different and is a substituent as described with reference to formula (III), and wherein the two groups $R^3$ may be linked to form an unsubstituted or substituted ring; $R^8$ is a substituent; and d is 0, 1, 2 or 3.

The aromatic carbon atoms of the fluorene repeat unit may be unsubstituted, or may be substituted with one or more substituents $R^8$. Exemplary substituents $R^8$ are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —NR$^5$— wherein $R^5$ is $C_{1-20}$ alkyl; unsubstituted phenyl; or phenyl substituted with one or more $C_{1-20}$ alkyl groups.

Repeat units of formula (VII) may be fully conjugating repeat units present in the copolymer of the, or may form one or more of the partially conjugating repeat units of the copolymer.

The extent of conjugation across repeat units of formula (VII) may be limited to form a partially conjugated repeat unit by: (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying substituents $R^8$ such as a $C_{1-20}$ alkyl substituent in one or both of the 3- and 6-positions.

The repeat unit of formula (VII) may be a fully conjugated 2,7-linked repeat unit of formula (VIIa):

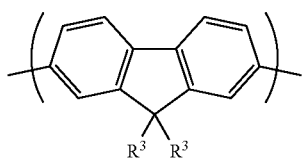
(VIIa)

The repeat unit of formula (VII) may be a partially conjugating 3,6-linked repeat unit of formula (VIIb):

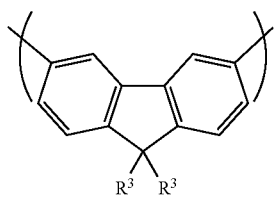
(VIIb)

The repeat unit of formula (VII) may be a partially conjugating 3,6-linked repeat unit of formula (VIIc):

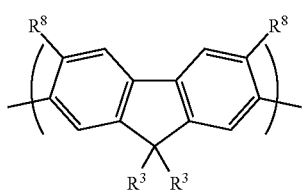
(VIIc)

One or both $R^3$ groups may be a crosslinkable group that is bound directly to the fluorene unit or is spaced apart therefrom by a spacer group as described above.

A preferred class of repeat units of formula (III) are disclosed in WO 2012/104579, the contents of which are incorporated herein by reference.

Another exemplary co-repeat unit has formula (VIII):

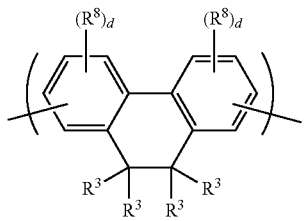
(VIII)

wherein $R^3$, $R^8$ and d are as described with reference to formulae (III) and (VII) above. Any of the $R^3$ groups may be linked to any other of the $R^3$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

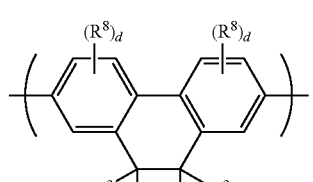
(VIIIa)

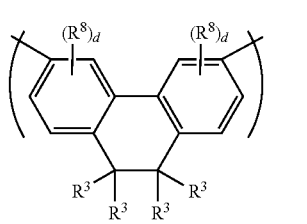
(VIIIb)

An exemplary repeat unit of formula (VIII) has the following structure, wherein aromatic carbon atoms may each independently be unsubstituted or substituted with a substituent $R^8$, and wherein the cyclopentyl groups may each independently be unsubstituted or substituted with one or more substituents, for example one or more $C_{1-20}$ alkyl groups:

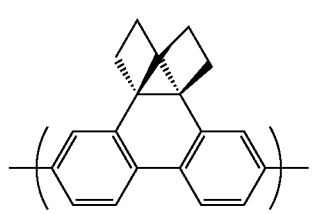

Conjugation of repeat units of formula (VIII) may be controlled as described with reference to formula (VII) to provide fully- or partially-conjugating repeat units.

The polymer may comprise a co-repeat unit of formula (IV):

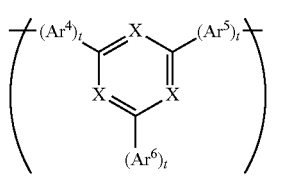
(IV)

wherein $Ar^4$, $Ar^5$ and $Ar^6$ are each independently an aryl or heteroaryl group, and may each independently be unsubstituted or substituted with one or more substituents $R^3$ as described above, optionally $C_{1-20}$ alkyl; t in each occurrence is independently at least 1, optionally 1, 2 or 3; and X is N or $CR^2$, wherein $R^2$ is H or a substituent, preferably H or $C_{1-10}$ alkyl.

Preferably, $Ar^4$, $Ar^5$ and $Ar^6$ of formula (IV) are each phenyl, each phenyl being optionally and independently substituted with one or more $C_{1-20}$ alkyl groups.

Preferably, at least one X is N. In one preferred embodiment, all 3 groups X are N.

If all 3 groups X are $CR^2$ then at least one of $Ar^1$, $Ar^2$ and $Ar^3$ is preferably a heteroaromatic group comprising N.

Ar$^6$ of formula (IV) is preferably phenyl, and is optionally substituted with one or more C$_{1-20}$ alkyl groups or a crosslinkable group.

A preferred repeat unit of formula (IV) is 2,4-6-triphenyl-1,3,5-triazine wherein the phenyl groups are unsubstituted or substituted with one or more C$_{1-20}$ alkyl groups.

The polymer may contain 1-50 mol % of partially conjugating repeat units.

The polymer may contain 1-50 mol %, optionally 1-30 mol %, of repeat units other than repeat units of formula (I) and partially conjugating repeat units.

Light-Emitting Layer

Light-emitting layer 105 may contain one or more suitable light-emitting materials including small molecule, dendrimeric and polymeric light-emitting materials. The light-emitting material may be fluorescent or phosphorescent. The light-emitting layer 105 may consist essentially of the one or more light-emitting materials, or may contain one or more further materials. Further materials may be selected from host materials and, in the case of fluorescent light-emitting layers, triplet-accepting materials for accepting triplet excitons from the fluorescent light-emitting material or materials for quenching of triplet excitons or to facilitate triplet-triplet annihilation and delayed fluorescence. Exemplary additive materials are polymers described in WO 2012/086671, the contents of which are incorporated herein by reference.

Light-emitting materials of the light-emitting layer or layers include red, green and blue light-emitting materials, each of which may be fluorescent or phosphorescent.

A blue emitting material may have a photoluminescent spectrum with a peak in the range of 400-490 nm, optionally 420-490 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

When used to form a hole-transporting layer, the lowest singlet and/or triplet excited state energy levels of the inventive polymer may be selected so as to avoid quenching of emission from the light-emitting material or materials of the light-emitting layer. The lowest singlet and triplet excited state energy levels may respectively be no more than 0.1 eV lower than, optionally the same as or higher than, the lowest singlet excited state energy level of a fluorescent emitter of the light-emitting layer, or the lowest triplet excited state energy level of a phosphorescent emitter of the light-emitting layer. The amount of partially conjugating repeat units may be selected according to the desired energy level of the polymer.

Exemplary phosphorescent light-emitting materials include metal complexes comprising substituted or unsubstituted complexes of formula (IX):

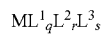
(IX)

wherein M is a metal; each of L$^1$, L$^2$ and L$^3$ is a coordinating group; q is an integer; r and s are each independently 0 or an integer; and the sum of (a. q)+(b. r)+(c.s) is equal to the number of coordination sites available on M, wherein a is the number of coordination sites on L$^1$, b is the number of coordination sites on L$^2$ and c is the number of coordination sites on L$^3$. Preferably each of a, b and c is 1, 2 or 3, preferably 1 or 2. In a preferred embodiment, each of a, b and c is 2. L$^1$, L$^2$ and L$^3$ may be the same, or at least one of L$^1$, L$^2$ and L$^3$ is different from the others of L$^1$, L$^2$ and L$^3$.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands L$^1$, L$^2$ and L$^3$ include carbon or nitrogen donors such as porphyrin or bidentate ligands of formula (X):

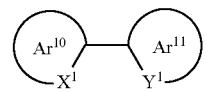
(X)

wherein Ar$^{10}$ and Ar$^{11}$ may be the same or different and are independently selected from substituted or unsubstituted aryl or heteroaryl; X$^1$ and Y$^1$ may be the same or different and are independently selected from carbon or nitrogen; and Ar$^{10}$ and Ar$^{11}$ may be fused together. Ligands wherein X$^1$ is carbon and Y$^1$ is nitrogen are preferred, in particular ligands in which Ar$^{10}$ is a single ring or fused heteroaromatic of N and C atoms only, for example pyridyl or isoquinoline, and Ar$^{11}$ is a single ring or fused aromatic, for example phenyl or naphthyl.

To achieve red emission, Ar$^{10}$ may be selected from phenyl, fluorene and naphthyl, and Ar$^{11}$ are selected from quinoline, isoquinoline, thiophene, and benzothiophene.

To achieve green emission, Ar$^{10}$ may be selected from phenyl or fluorene. Ar$^{11}$ may be pyridine.

To achieve blue emission, Ar$^{10}$ may be phenyl and Ar$^{11}$ may be imidazole, triazole or tetrazole.

Examples of bidentate ligands are illustrated below:

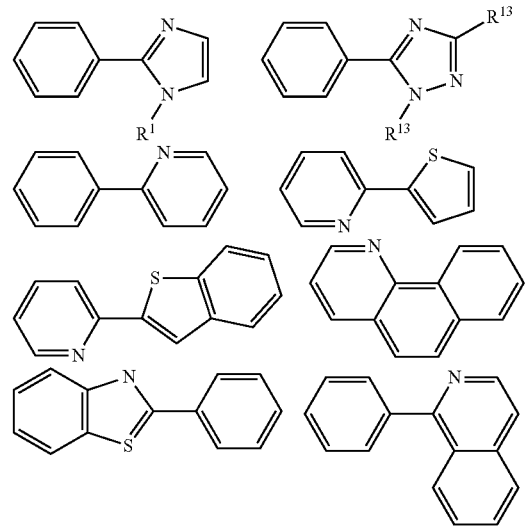

wherein R$^{13}$ in each occurrence is H or C$_{1-20}$ alkyl.

Each of Ar$^{10}$ and Ar$^{11}$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents include groups $R^3$ as described above with reference to Formula (III). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; and dendrons which may be used to obtain or enhance solution processability of the metal complex, for example as disclosed in WO 02/66552.

A light-emitting dendrimer may comprise a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

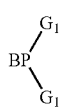

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

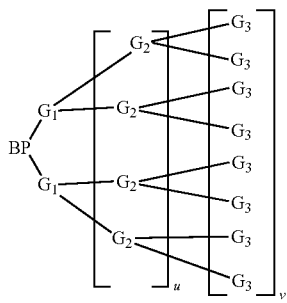

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl.

A preferred dendron is a substituted or unsubstituted dendron of formula (XIb):

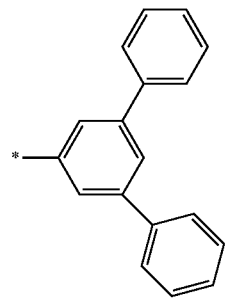

(XIb)

wherein * represents an attachment point of the dendron to a core.

BP and/or any group G may be substituted with one or more substituents, for example one or more $C_{1-20}$ alkyl or alkoxy groups.

Phosphorescent light-emitting materials may be provided in a light-emitting layer with a host material. The host material has a lowest triplet excited state energy level that is no more than 0.1 eV lower than, and is preferably at least the same as or higher than, the lowest triplet excited state energy level of the material it is used with.

The phosphorescent light-emitting material may be physically mixed with the host polymer or may be covalently bound thereto. The phosphorescent light-emitting material may be provided in a side-chain, main chain or end-group of a host polymer. Where the phosphorescent material is provided in a polymer side-chain, the phosphorescent material may be directly bound to the backbone of the polymer or spaced apart therefrom by a spacer group, for example a $C_{1-20}$ alkyl spacer group in which one or more non-adjacent C atoms may be replaced by O or S.

The light-emitting material may be any form of organic fluorescent material including, without limitation, small molecules, dendrimeric and polymeric fluorescent materials.

A light-emitting polymer may be a light-emitting homopolymer comprising light-emitting repeat units, or it may be a copolymer comprising light-emitting repeat units and further repeat units such as hole transporting and/or electron transporting repeat units as disclosed in, for example, WO 00/55927. Each repeat unit may be provided in a main chain or side chain of the polymer.

A light-emitting polymer may contain repeat units in the polymer backbone that are conjugated together.

Light-emitting polymers may contain arylamine repeat units, for example repeat units of formula (XII):

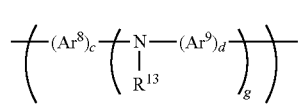

(XII)

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{12}$, a branched or linear chain of $Ar^{12}$ groups, or a crosslinkable unit that is bound directly to the N atom of formula (XII) or spaced apart therefrom by a spacer group, wherein $Ar^{12}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{12}$ in the repeat unit of Formula (XII) may be linked by a direct bond or a divalent linking atom or group to another of $Ar^8$, $Ar^9$ and $Ar^{12}$. Preferred divalent linking atoms and groups include O, S; substituted N; and substituted C.

Any of $Ar^8$, $Ar^9$ and, if present, $Ar^{12}$ may be substituted with one or more substituents. Exemplary substituents are substituents $R^{12}$, wherein each $R^{12}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutene group Preferred repeat units of formula (XII) have formulae 1-3:

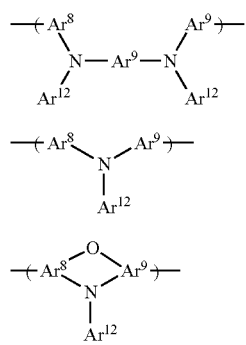

A light-emitting polymer may contain one, two or more different repeat units of formula (XII).

In one optional arrangement, central $Ar^9$ group linked to two N atoms, for example as in formula 1, is phenylene that may be unsubstituted or substituted with one or more substituents $R^{12}$.

In another optional arrangement, the central $Ar^9$ group of formula 1 is a polycyclic aromatic that may be unsubstituted or substituted with one or more substituents $R^{10}$. Exemplary polycyclic aromatic groups are naphthalene, perylene, anthracene and fluorene. Each of these polycyclic aromatic groups may be substituted with one or more substituents $R^{12}$. Two substituents $R^{12}$ may be linked to form a substituted or unsubstituted ring.

Optionally, $Ar^8$ is phenyl that may be unsubstituted or substituted with one or more substituents $R^{12}$.

Optionally, $Ar^9$ groups linked to only one N atom of the repeat unit of formula (XII) are phenyl that may be unsubstituted or substituted with one or more substituents $R^{12}$.

$R^{13}$ of formula (XII) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

Optionally, $R^{13}$ is $Ar^{12}$, for example phenyl, or is —$(Ar^{12})_r$ wherein r is at least 2 and wherein the group —$(Ar^{12})_r$ forms a linear or branched chain of aromatic or heteroaromatic groups, for example 3,5-diphenylbenzene wherein each phenyl may be substituted with one or more substituents $R^{10}$, for example one or more $C_{1-20}$ alkyl groups. Repeat units of this type are described in WO 2010/001982, the contents of which are incorporated herein by reference.

Optionally, c, d and g are each 1 and $Ar^8$ and $Ar^9$ are phenyl linked by an oxygen atom to form a phenoxazine ring.

Amine repeat units may provide hole-transporting and/or light-emitting functionality. Exemplary light-emitting amine repeat units include a blue fluorescent light-emitting repeat unit of formula (XIIa) and a green light-emitting repeat unit formula (XIIb):

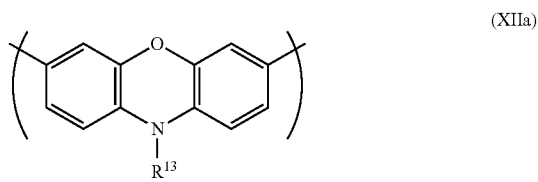

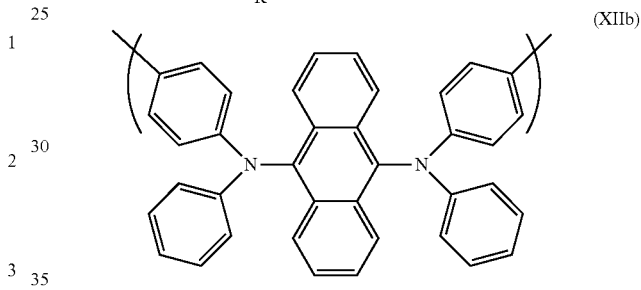

The repeat units of formula (XIIa) and (XIIb) may be unsubstituted or one or more of the rings of the repeat unit of formula (XIIb) may be substituted with one or more substituents $R^{15}$, preferably one or more $C_{1-20}$ alkyl groups.

Amine repeat units may be provided in a copolymer with one or more co-repeat units, and may form 0.5 mol % up to about 50 mol % of the repeat units of the light-emitting copolymer, optionally about 1-25 mol %, optionally about 1-10 mol %.

Exemplary co-repeat units include, without limitation, fluorene, phenylene, indenofluorene, phenanthrene and dihydrophenanthrene repeat units. Co-repeat units of the light-emitting polymer may include one or more of the co-repeat units (III), (VII) and (VIII) described above; phenanthrene repeat units; naphthalene repeat units; anthracene repeat units; and perylene repeat units. Each of these repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be substituted or unsubstituted, for example substituted with one or more $C_{1-40}$ hydrocarbyl groups.

Polymer Synthesis

Preferred methods for preparation of conjugated polymers as described herein, including hole-transporting and light-emitting conjugated polymers, comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Hole Injection Layers

A conductive hole injection layer, which may be formed from a conductive organic or inorganic material, may be provided between the anode 101 and the hole-transporting layer 103 of an OLED as illustrated in FIG. 1 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode 107 is selected from materials that have a workfunction allowing injection of electrons into the light-emitting layer of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin (e.g. 1-5 nm) layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a layer of the inventive polymer may be formed from the polymer and one or more suitable solvents.

Solvents suitable for dissolving compositions of the invention, particularly compositions containing polymers comprising alkyl substituents, include benzenes substituted with one or more $C_{1-10}$ alkyl or $C_{1-10}$ alkoxy groups, for example toluene, xylenes and methylanisoles.

Particularly preferred solution deposition techniques including printing and coating techniques such spin-coating and inkjet printing.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device).

The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

Hole-transporting layer 103 may be formed using a formulation of the inventive polymer to form an uncrosslinked layer of the polymer followed by crosslinking of crosslinkable substituents of the polymer to render hole-transporting layer 103 insoluble in solvents used to form the overlying layer of the device. Crosslinkable groups may be provided as substituents of the repeat unit of formula (I) and/or as substituents of co-repeat units.

EXAMPLES

Monomer Example 1

Monomer Example 1 was prepared according to the following reaction scheme:

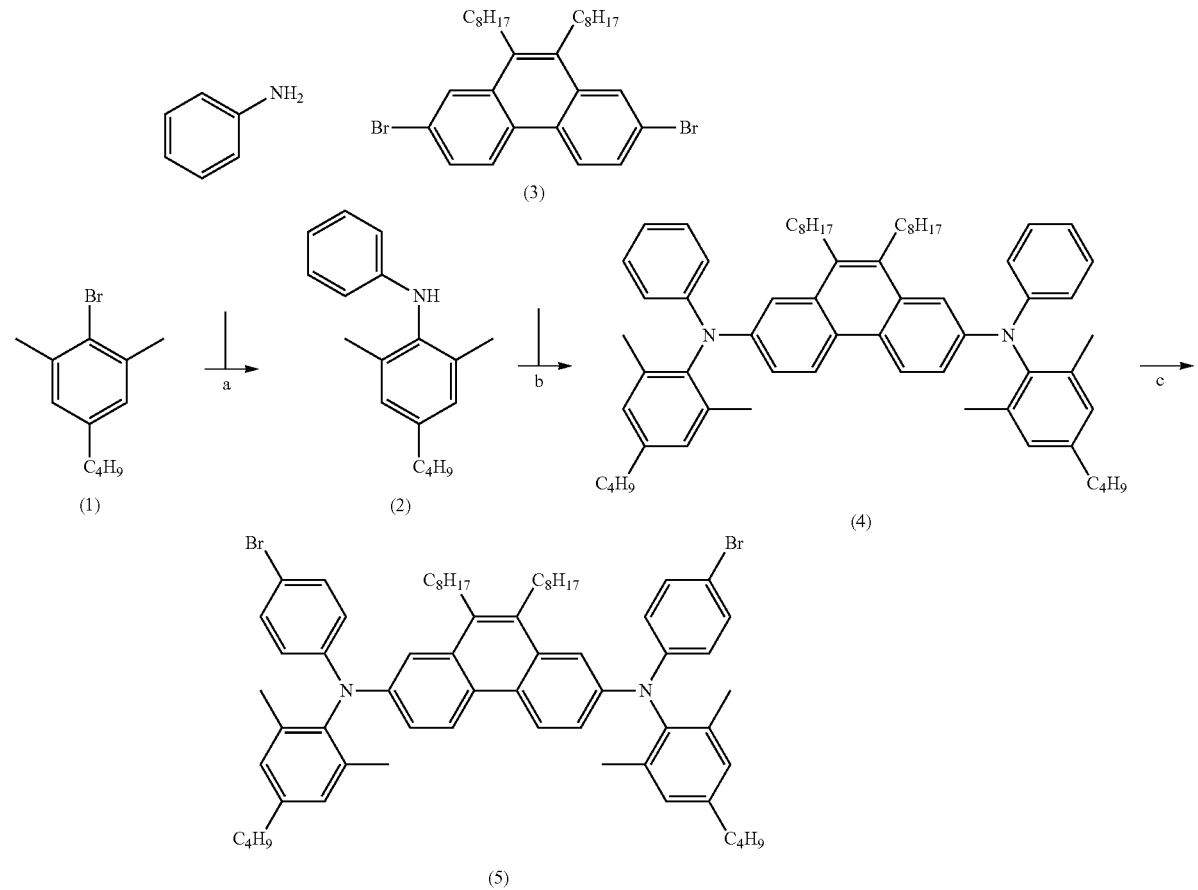

a... Pd$_2$(DBA)$_3$, ($^t$Bu)$_3$PHBF$_4$, NaO$^t$Bu, toluene
b... Pd$_2$(DBA)$_3$, ($^t$Bu)$_3$PHBF$_4$, NaO$^t$Bu, toluene
c... NBS, DMF, CHCl$_3$, -15° C.

Monomer Example 1

Synthesis of (2)—

A mixture of aniline (0.62 mol), 1-bromo-4-butyl-2,6-dimethylbenzene (0.25 mol), tris(dibenzylideneacetone)dipalladium(0) (0.005 mol), tri-tert-butylphosphonium tetrafluoroborate (0.02 mol) and sodium-tert-butoxide (0.6 mol) in toluene (1.5 L) was heated to reflux for 20 hours. After aqueous work up and purification by column chromatography, (2) was obtained in 89% yield.

Synthesis of (4)—

2,7-Dibromo-9,10-dioctyl phenanthrene (0.045 mol), (2) 0.11 mol, tris(dibenzylideneacetone)dipalladium(0) (0.9 mmol) and tri-tert-butyl phosphonium tetrafluoroborate (3.6 mmol) and sodium-tert-pentoxide (0.10 mol) in toluene (600 ml) was heated to reflux for 20 hours. After aqueous work up and purification by column chromatography, (4) was obtained in 66% yield.

Synthesis of (5)—

Compound (4) (29 mmol) was brominated by the action of NBS (2.28 eq.) in chloroform (260 ml) and dimethylformamide (115 ml). The reaction was quenched with water and methanol. Purification of (4) was carried out by column chromatography and recrystallisation until the desired purity was reached. A 70% yield was obtained.

Monomer Example 2 added portion-wise as a solid. The final mixture was sparged for a further 10 minutes and slowly heated up to reflux and heated until no starting material was seen by TLC. After aqueous work-up and purification by column chromatography (2) was obtained (235 g, 98% yield)

Synthesis of (3)

To a solution of (2) (50 g, 66.4 mmol) and 5-bromo-m-xylene (27 ml, 199 mmol) in 800 ml of toluene (anhydrous) were added as solid bis(dibenzylideneacetone) palladium (0) (1.82 g, 2 mmol) and tri-tert-butylphosphoniumtetrafluoroborate (1.73 g, 6 mmol). The mixture was then sparged with nitrogen gas, following which sodium tert-butoxide (25.5 g g, 266 mmol) was portion wise added as a solid. The

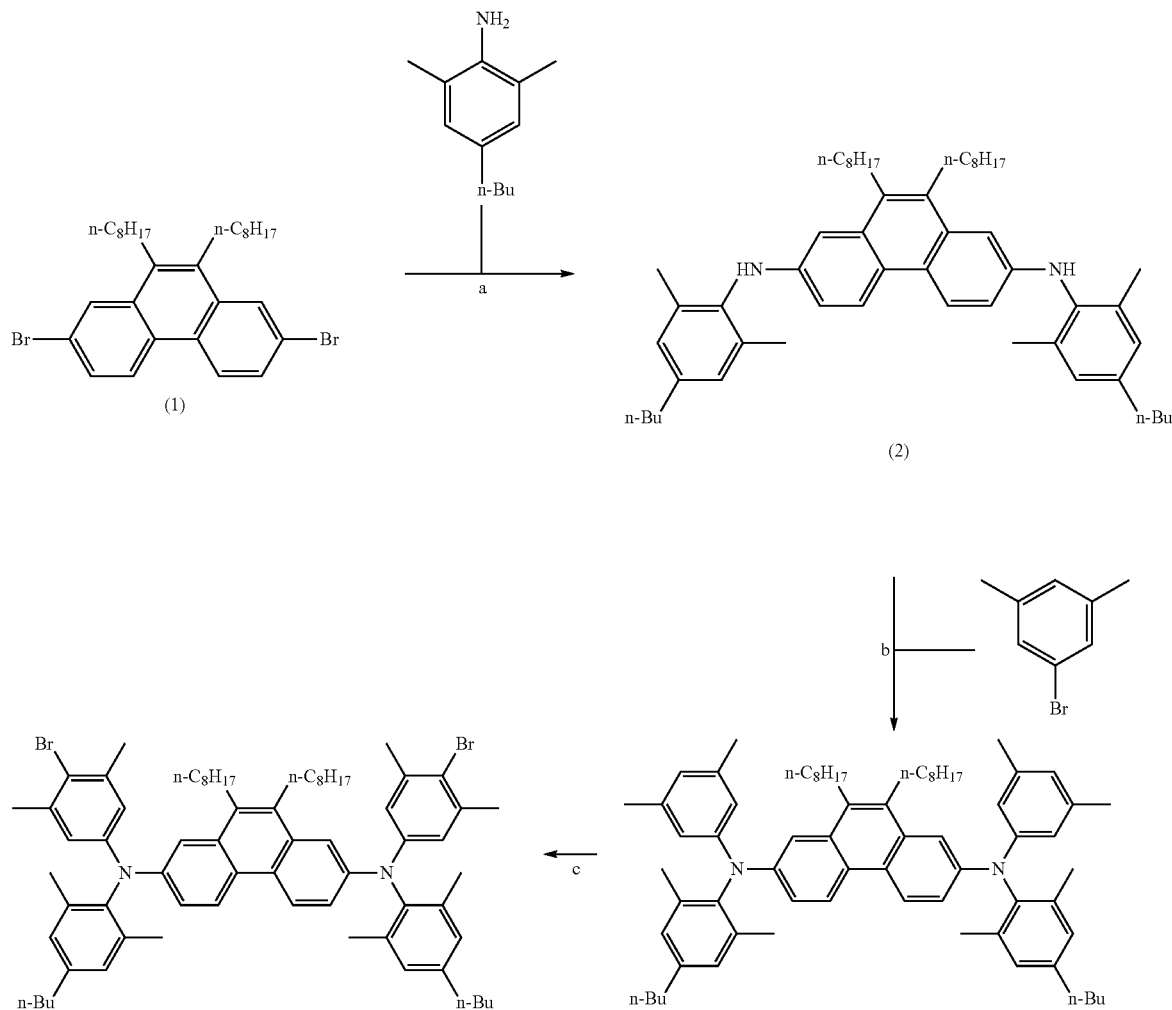

Monomer example 2
a: Pd₂(dba)₃, HPtBu₃BF₄ NaOtBu toluene reflux
b: Pd₂(dba)₃, HPtBu₃BF₄ NaOtBu toluene reflux
c: NBS CHCl₃ -40° C.

Synthesis of (2)

To a solution of 1 (180 g, 0.3211 mol) and 4-butyl-2,6-dimethylaniline (125.3 g, 0.7066 mol) in 1800 ml of toluene (anhydrous) were added as solid bis(dibenzylideneacetone) palladium (0) (1.47 g, 0.0016 mol) and tri-tert-butylphosphoniumtetrafluoroborate (0.90 g 0.0024 mol).

The mixture was then sparged with nitrogen gas, following which sodium tert-butoxide (92.6 g, 0.9635 mol) was final mixture was sparged for a further 10 minutes and slowly heated up to reflux and heated until no starting material was seen by TLC. After aqueous work-up and purification by column chromatography (3) was obtained as a red oil Synthesis of (4)

A solution of (3) (28.91 g, 30.07 mmol) in 220 ml of chloroform (anhydrous) was sparged with nitrogen for 20 minutes before cooling down to −40° C. A solution of N-bromosuccinimide (10.44 g, 58.63 mmol) in 200 ml of N,N-dimethylformamide (anhydrous) added drop wise to the reaction mixture. The reaction mixture was allowed to warm to room temperature and the conversion checked by HPLC. Further small portions of NBS were added as required to achieve optimum conversion to the dibromide without formation of tribromide. After aqueous work-up the white solid was purified by repeated recrystallisation to obtain Monomer example 2 (28 g at 99.46% by HPLC (83% yield)

Monomer Example 3

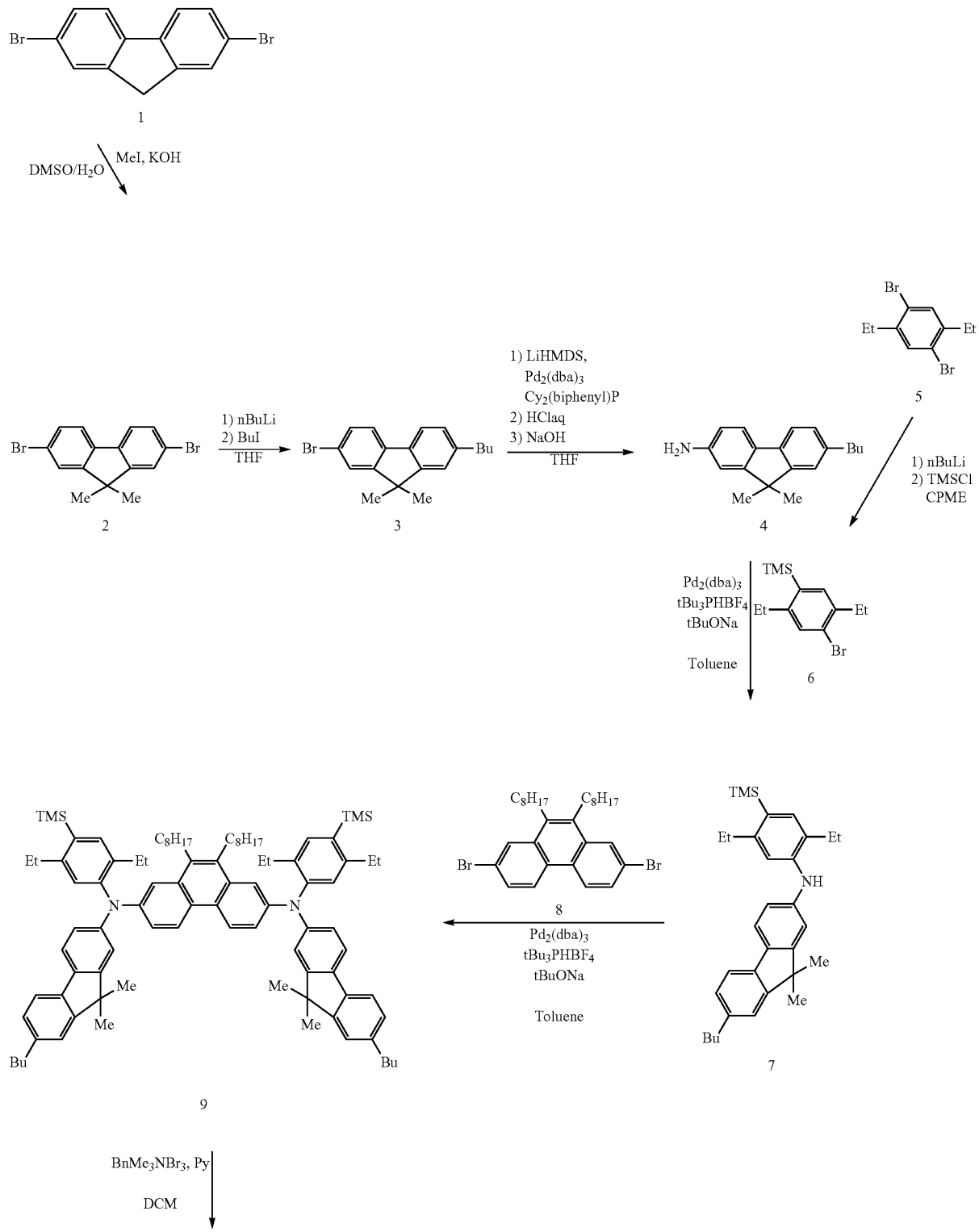

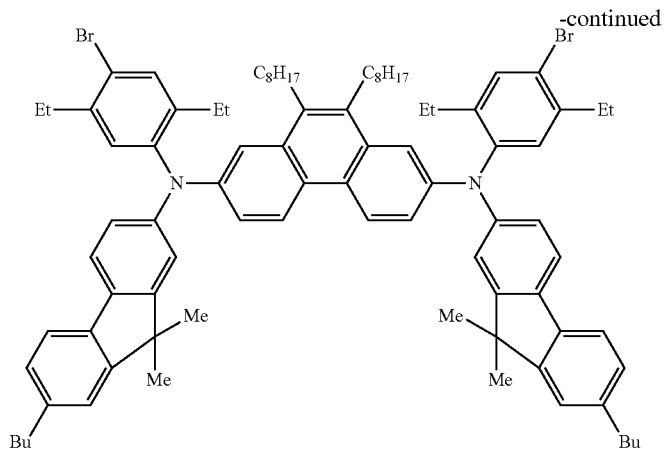

Monomer example 3

Synthesis of (3)

A solution of (2) (70 g, 198.83 mmol) in THF (1400 mL) was cooled to below −60° C. and a solution of n-BuLi (91 mL of a 2.5M solution in hexane, 228.65 mmol) was added dropwise. After addition was complete the mixture was stirred for a further 1 hour and warmed to between −40 and −50° C. Butyl iodide (45.5 mL, 398 mmol) was then added dropwise and the reaction allowed to warm to room temperature and stirred overnight. After aqueous work-up, passage through silica eluting with toluene/acetonitrile and thorough drying (3) was obtained as a brown oil (98% yield)

Synthesis of (4)

To a mixture of 3 (20 g, 45.56 mmol), $Pd_2(dba)_3$ and cyclohexyl JohnPhos under nitrogen was added THF (80 mL) and the solution sparged with nitrogen for 10 minutes. To the solution was added $LiN(SiMe_3)_2$ in THF (68.3 mL of a 1M solution, 68.33 mmol) dropwise. After the addition was finished the reaction mixture was heated to reflux for 3 hours and then cooled to 10° C. and 2M HCl (125 mL) added dropwise, followed by a solution of 10% NaOH (102 mL). the mixture was diluted with toluene (200 mL) and acetonitrile (100 mL). After aqueous work-up and purification by chromatography over silica gel 4 was obtained as a brown solid (11.8 g, 89% yield Synthesis of 6

A solution of 1,4-dibromo-2,5-diethylbenzene (130 g, 445.19 mmol) in cyclopentylmethylether (CPME) (1950 mL) under nitrogen atmosphere was cooled to an internal temperature of <−65° C. added n-butyl lithium (207 mL, 516.4 mmol) dropwise over 30 minutes. The reaction mixture was then allowed to warm slowly to an internal temperature of −25° C. and trimethylsilylchloride (68 mL, 534 mmol) was added dropwise over 30 minutes. The reaction was quenched with water (390 mL) and subjected to aqueous work-up before being purified by passage through silica gel eluting with toluene/acetonitrile. Evaporation of the solvent yielded 6 as a colourless oil (127 g, 99% yield).

Synthesis of 7

A solution of 4 (20.6 g, 77.6 mmol), $tBu_3PHBF_4$ (0.471 g, 1.622 mmol), $Pd_2(dba)_3$ (0.707 g, 0.772 mmol) and toluene (164 mL) was prepared and the mixture sparged with nitrogen for 10 minutes, following which tBuONa (11.13 g, 115.87 mmol) was added as a solid. To this was added dropwise a solution of 6 (21.10 g, 74 mmol) in toluene (207 mL) under nitrogen. After the addition was complete the reaction mixture was heated to 60° C. for 4 hours. The reaction mixture was allowed to cool to room temperature and hexane (410 mL) was added. After aqueous work-up the organic phase was passed through silica, eluting with toluene/acetonitrile and the volatiles removed. The material was redissolved in toluene/hexane (2:1) and passed through a plug of silica, eluting with toluene/hexane (2:1). Removal of the volatiles afforded 7 as a red oil, (34.3 g, 98.7% yield)

Synthesis of 9

To a mixture of 8 (15.563 g, 27.77 mmol), $tBu_3PHBF_4$ and $Pd_2(dba)_3$ under a nitrogen atmosphere was added a solution of 7 (28.7 g, 61.1 mmol) in toluene (271 mL) and the resulting solution sparged with nitrogen for 10 minutes. To the solution was added sodium tert-pentoxide (9.175 g, 83.31 mmol) as a solid and the mixture heated to 50° C. for 4 hours, after which it was allowed to cool to room temperature. Hexane (280 mL) was added to the reaction mixture and aqueous work-up carried out. Removal of the volatiles afforded a brown oil which was redissolved in toluene/hexane and passed through a plug of silica, eluting with further toluene/hexane. The volatiles were removed and the oil redissolved in hexane. Ethanol was added dropwise to afford a precipitate of a yellow sticky solid. This was washed with methanol and the washings combined with the mother liquors, resulting in a further small crop of yellow solid. The two crops of yellow solid were combined and redissolved in hexane and the resulting brown solution was treated with activated carbon and filtered through celite to afford a yellow-brown solution. This process was repeated and the volatiles removed to afford 9 as a yellow oil that solidified on standing to a yellow solid. The yellow solid was further purified by recrystallisation three times from hexane/ethanol/methanol to afford 9 as a yellow solid in 75% yield.

Synthesis of Monomer Example 3

To a solution of 9 (28 g, 20.92 mmol) in dichloromethane (280 mL) maintained between −10 and −20° C. was added pyridine (5 mL, 62.8 mmol), followed by addition of benzyltrimethylammonium tribromide (16.319 g, 41.85 mmol) in four portions with 2 hours stirring between each. After the final period of stirring the reaction mixture was poured into methanol (1400 mL) and the mixture filtered. The filtrate was washed with methanol and the pale yellow solid was purified by passage through silica, eluting with toluene/hexane (1:4), followed by repeated recrystallisation from hexane/ethanol/methanol (1:2:0.7) to afford monomer example 3 in 93% yield.

Polymers
Polymers were prepared by Suzuki polymerisation as described in WO 00/53656 of the monomers illustrated below in the amounts provided in Tables 1 and 2:
1
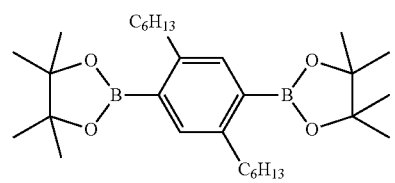
2 (Monomer example 1)
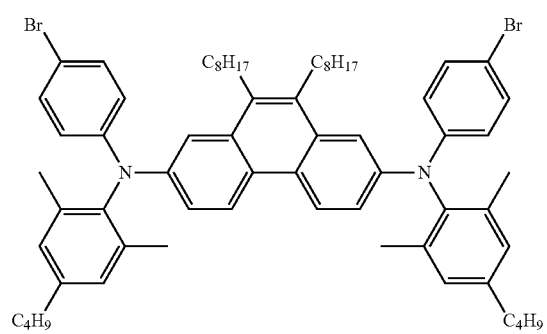
3
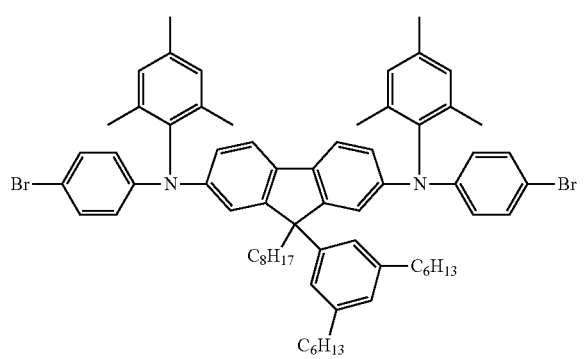
4
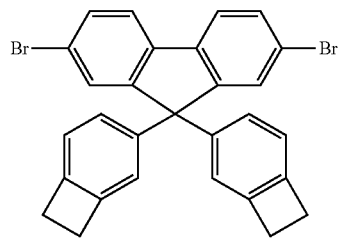
5
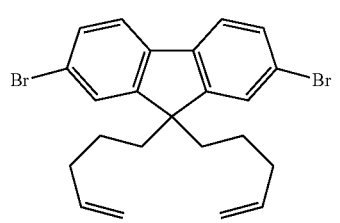
-continued
6 (Monomer example 2)
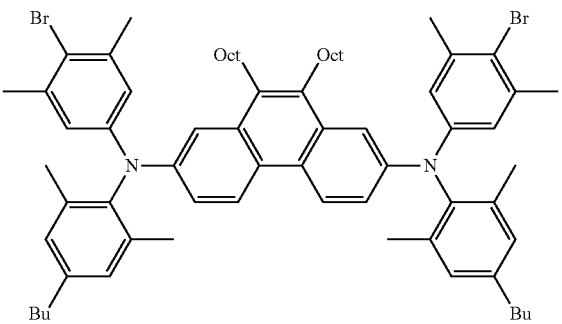
7
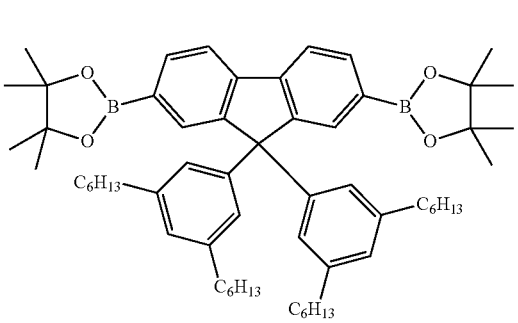
8
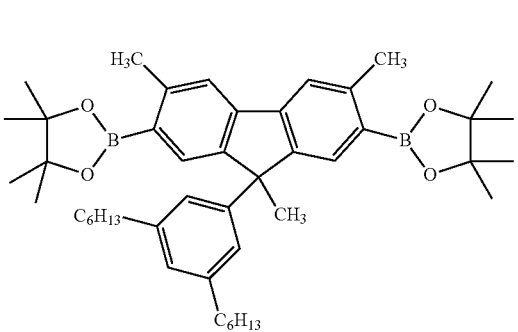
9
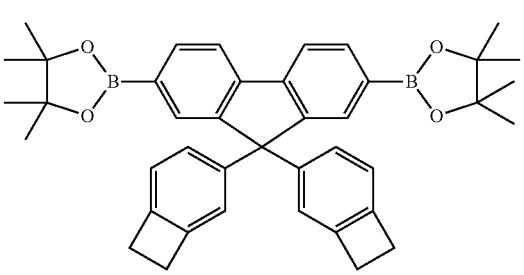
10
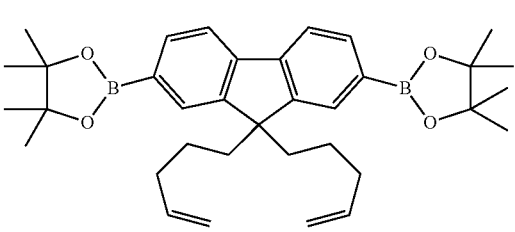

-continued 11 (Monomer Example 3)

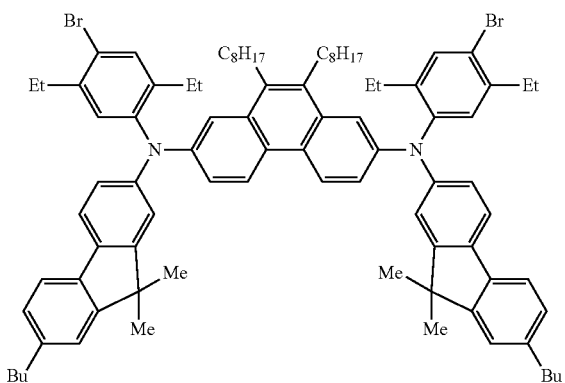

wherein "Oct" is n-octyl.

fluorescent light-emitting polymer formed by Suzuki polymerisation as described in WO 00/53656 and comprising fluorene repeat units of formula (VIIa), repeat units of formula (VIIIa) and amine repeat units of formula (XII) and an additive polymer. The cathode was formed by evaporation of a first layer of a metal fluoride to a thickness of about 2 nm, a second layer of aluminium to a thickness of about 100 nm and a third layer of silver to a thickness of about 100 nm.

Green Phosphorescent Device Examples

Green devices were prepared as described in Device Example 1 except that the blue fluorescent light-emitting layer was replaced by a green phosphorescent light-emitting layer of a composition of a host polymer (60 wt %) and Green Phosphorescent Emitter 1 (40 wt %).

The host polymer was prepared by Suzuki polymerisation as described in WO 00/53656 of alkyl-substituted phenylene repeat units of formula (IIIa) and triphenyltriazine repeat units of formula (IV):

TABLE 1

| Polymer | Arylene monomer (mol %) | Arylene diamine monomer (mol %) | Crosslinking monomers (mol %) | Phenanthrene diamine repeat unit | Partially conjugating repeat unit |
|---|---|---|---|---|---|
| Comparative Polymer 1 | 1 (49.5) | 3 (40) | 4 (5) 5 (5) | N | Y |
| Polymer Example 1 | 1 (49.5) | 2 (40) | 4 (5) 5 (5) | Y | Y |
| Polymer Example 2 | 7 (40) | 6 (50) | 9 (5) 10 (5) | Y | Y |
| Polymer Example 3 | 1 (50) | 2 (40) | 4 (5) 5 (5) | Y | Y |
| Comparative Polymer 3 | 1 (50) | 3 (40) | 4 (5) 5 (5) | N | Y |
| Polymer Example 4 | 8 (50) | 2 (40) | 4 (5) 5 (5) | Y | Y |
| Comparative Polymer 4A | 8 (50) | 3 (40) | 4 (5) 5 (5) | N | Y |
| Comparative Polymer 4B | 7 (50) | 2 (40) | 4 (5) 5 (5) | Y | N |
| Polymer Example 5 | 7 (40) | 11 (50) | 9 (5) 10 (5) | Y | Y |

In Polymer Examples 2 and 5 the repeat unit of formula (I), formed by polymerisation of monomer 6 (Monomer Example 2) and monomer 11 (Monomer Example 3) respectively, provides the partially conjugating repeat unit.

In Polymer Examples 1, 3 and 4 the repeat unit formed by polymerisation of monomer 1 (twisted phenylene repeat unit) or monomer 8 (twisted fluorene repeat unit) provides the partially conjugating repeat unit.

Blue Fluorescent Device Examples

Blue organic light-emitting devices having the following structure were prepared:

ITO/HIL/HTL/LE/Cathode, wherein ITO is an indium-tin oxide anode; HIL is a hole-injecting layer; HTL is a hole-transporting layer; LE is a light-emitting layer; and the cathode comprises a layer of metal fluoride in contact with the light-emitting layer and a layer of silver and a layer of aluminium.

To form the device, a substrate carrying ITO was cleaned using UV/Ozone. The hole injection layer was formed by spin-coating an aqueous formulation of a hole-injection material available from Plextronics, Inc. The hole transporting layer was formed by spin-coating a Polymer Example of Table 1 and crosslinking the polymer by heating. The light-emitting layer was formed by spin-coating a blue Green Phosphorescent Emitter 1 has the following structure:

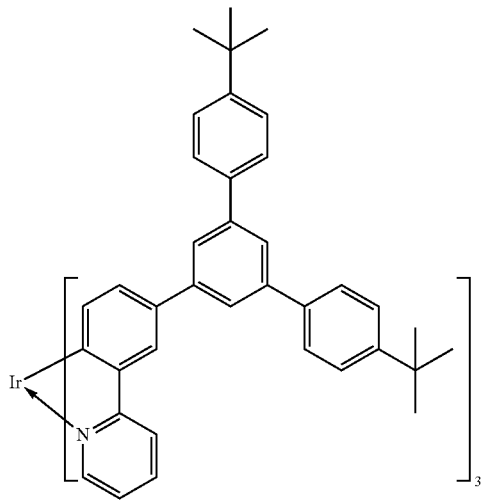

Results for blue fluorescent devices are provided in Table 2, wherein T95 and T80 represent the time taken for device brightness to fall to 95% and 80% respectively of a starting brightness of 1000 cd/m2.

The T95 and T80 values for devices containing exemplary polymers are higher than devices containing comparative polymers. CIE (x,y) colour co-ordinates and external quantum efficiencies (EQE) are similar.

TABLE 2 fluorescent blue device results

| Hole-transporting layer | T95 (1000 cd/m2) normalised | T80 (1000 cd/m2) normalised | CIE | EQE maximum (%) | EQE 1k |
|---|---|---|---|---|---|
| Polymer Example 3 | 2.6 | 1.7 | 0.137, 0.123 | 11.1 | 10.9 |
| Comparative Polymer 3 | 1 | 1 | 0.137, 0.126 | 10.9 | 10.9 |
| Polymer Example 4 | 3.3 | 1.9 | 0.137, 0.125 | 10.8 | 10.7 |
| Comparative Polymer 4A | 1.5 | 1.3 | 0.137, 0.126 | 11.4 | 11.3 |
| Polymer Example 2 | 2 | 1.6 | 0.138, 0.123 | 10.7 | 10.4 |
| Polymer Example 5 | 1.7 | 1.3 | 0.137, 0.122 | 10.7 | 10.5 |

Results for green phosphorescent devices are provided in Table 3, wherein T90 and T50 represent the time taken for device brightness to fall to 90% and 50% respectively of a starting brightness of 24,000 cd/m2.

The T90 and T50 values for devices containing exemplary polymers are higher than devices containing comparative polymers.

The T50 value for Polymer Examples 2 and 5, in which the repeat unit of formula (I) is twisted, is higher than the T50 values for Polymer Examples 3 and 4, in which a co-repeat unit provides a twist along the polymer backbone.

TABLE 3 phosphorescent green device results (1)

| Hole-transporting layer | T90 (24000 cd/m2) normalised | T50 (24000 cd/m2) normalised | CIE | Efficiency (Cd/A) |
|---|---|---|---|---|
| Comparative Polymer 3 | 1.0 | 1.0 | 0.318, 0.638 | 81 |
| Polymer Example 3 | 2.4 | 1.9 | 0.314, 0.641 | 73 |
| Comparative Polymer 4A | 0.9 | 1.0 | 0.314, 0.640 | 81 |
| Polymer Example 4 | 1.5 | 1.3 | 0.315, 0.640 | 77 |
| Polymer Example 2 | 1.6 | 2.5 | 0.313, 0.642 | 82 |
| Polymer Example 5 | 1.8 | 2.2 | 0.312, 0.642 | 80 |

Green Phosphorescent Device Results (2)

The results set out in Table 3 show higher lifetime and comparable efficiency and colour for devices containing Polymer Example 4 and Comparative Polymer 4A.

Polymer Example 4 and Comparative Polymer 4A both contain a partially conjugating fluorene repeat unit derived from monomer 8, but only Polymer Example 4 contains a repeat unit of formula (I).

Green phosphorescent devices were prepared as described above. A Device Example 1 was prepared in which Polymer Example 4 was used to form the hole-transporting layer, and a Comparative Device was prepared in which Comparative Polymer 4B was used to form the hole-transporting layer.

Results are set out in Table 4. Comparative Polymer 4B does contain a repeat unit of formula (I), but does not contain a partially conjugating repeat unit.

The results for Polymer Example 4, Comparative 4A and Comparative 4B demonstrate that improved performance is achieved not through the presence or absence of a single repeat unit but through a combination of a repeat unit of formula (I) and a partially conjugating repeat unit.

TABLE 4

| Hole-transporting layer | T60 (24000 cd/m2) normalised | Voltage at 10 mA/cm2 | Efficiency (Cd/A) |
|---|---|---|---|
| Polymer Example 4 | 2.1 | 5.1 | 82 |
| Comparative Polymer 4B | 1 | 4.84 | 50 |

Green Phosphorescent Device Results (3)

Green phosphorescent devices were prepared as described above. Device Example 2 was prepared in which Polymer Example 1 was used to form the hole-transporting layer, and a Comparative Device 2 was prepared in which Comparative Polymer 1 was used to form the hole-transporting layer.

Figure 2:
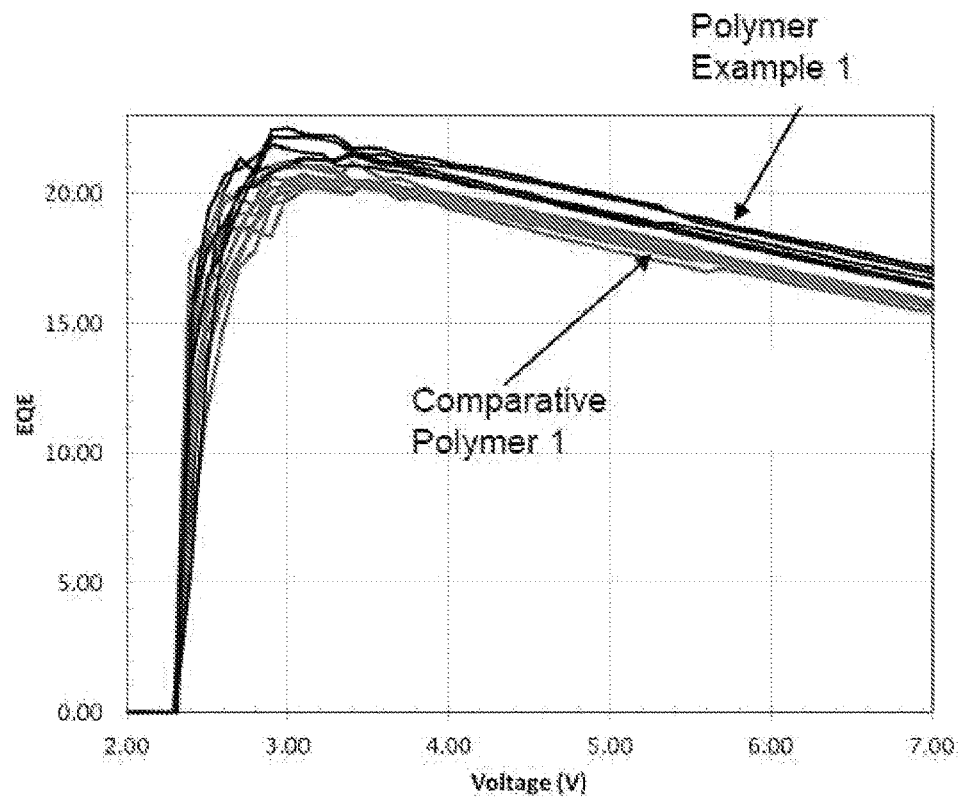
FIG. 2 is a graph of external quantum efficiency vs. voltage for an exemplary green OLED device and a comparative green OLED.

With reference to FIG. 2, external quantum efficiency of Device Example 2 is higher than that of Comparative Device 2 at voltages above about 2.5 V.

Figure 3:
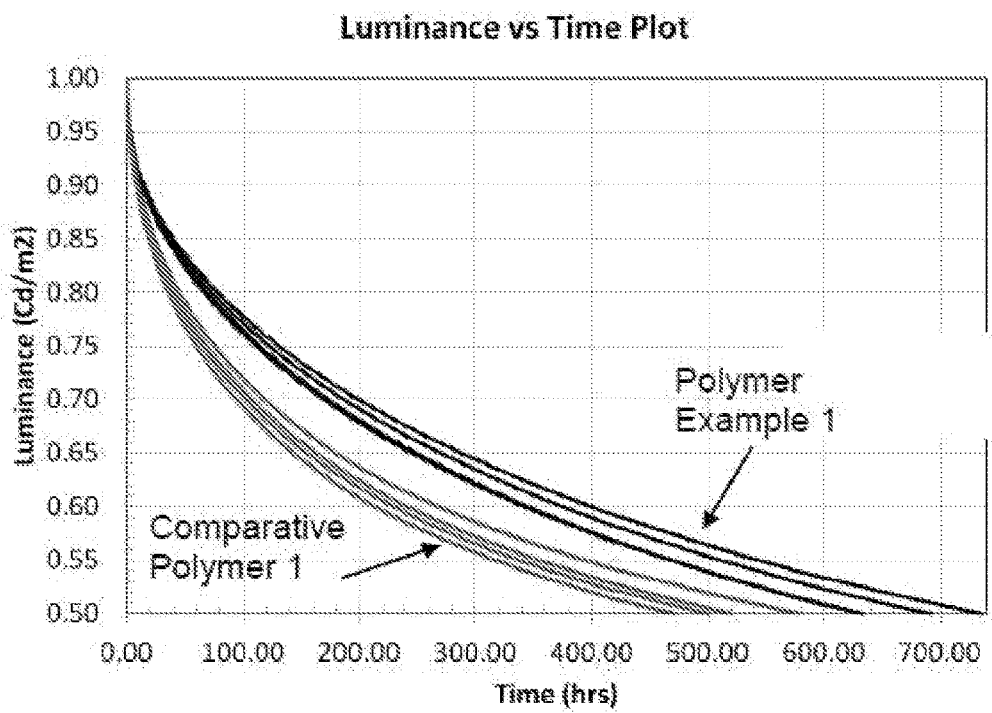
FIG. 3 is a graph of luminance vs. time for the exemplary green OLED and comparative green OLED of FIG. 2.

With reference to FIG. 3, half life of Device Example 2 (the time taken for brightness of a device to fall to 50% of a starting luminance at constant current) is higher than that of Comparative Device 2. Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A copolymer comprising a repeat unit of Formula (I) and at least one further repeat unit:

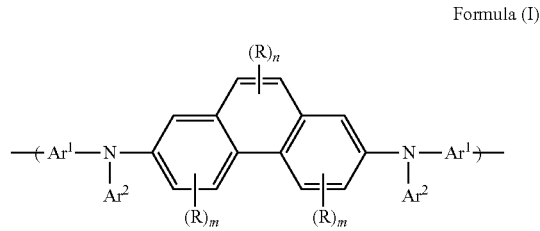

Formula (I)

wherein:
Ar¹ and Ar² are each independently aryl or heteroaryl, each of which is independently unsubstituted or substituted with one or more substituents;
each R is independently a substituent;
each n is independently 0, 1, or 2;
each m is independently 0, 1, 2, or 3, and at least one of the repeat units of the polymer is a partially conjugating repeat unit;
wherein at least one repeat unit of the polymer is substituted with a crosslinkable group.

2. The copolymer of claim 1, wherein at least one of m and n is at least 1, and each R is independently selected from the group consisting of:

$C_{1-20}$ alkyl wherein one or more non-adjacent C atoms may be replaced with O, S, $NR^{11}$, C=O or COO; wherein $R^{11}$ is a substituent aryl or heteroaryl that may be unsubstituted or substituted with one or more substituents;

a branched or linear chain of aryl or heteroaryl groups wherein each aryl or heteroaryl is independently unsubstituted or substituted with one or more substituents; and a crosslinkable-group.

3. The copolymer of claim 1, wherein each R is independently a $C_{1-40}$ hydrocarbyl group.

4. The copolymer of claim 1, wherein n=2.

5. The copolymer of claim 1, wherein the repeat unit of formula (I) has Formula (II):

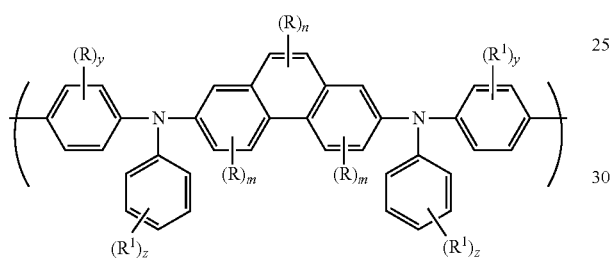

(II)

wherein $R^1$ in each occurrence is a substituent; each y is independently 0, 1, 2, 3 or 4; and each z is independently 0, 1, 2, 3, 4 or 5.

6. The copolymer of claim 1, wherein the repeat unit of formula (I) is a partially conjugating repeat unit.

7. The copolymer of claim 6 wherein the repeat unit of formula (I) has formula (XIV):

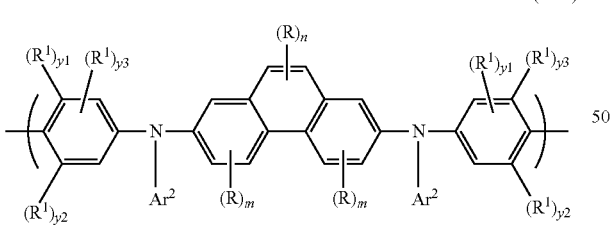

(XIV)

wherein R, $Ar^2$, n and m are as defined in claim 1;

wherein $R^1$ in each occurrence is a substituent;

y1 and y2 are each independently 0 or 1 with the proviso that at least one of y1 and y2 is 1; and each y3 is independently 0, 1 or 2.

8. The copolymer of claim 1, wherein a further repeat unit is a partially conjugating repeat unit.

9. The copolymer of claim 8, wherein the partially conjugating repeat unit is a repeat unit of formula (IIIa), (IIIb) or (IIIc):

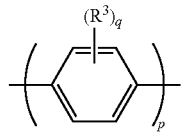

(IIIa)

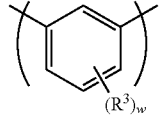

(IIIb)

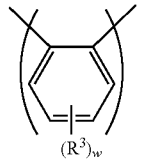

(IIIc)

wherein p is 1, 2 or 3; q in each occurrence is independently 1, 2, 3 or 4; w is 0, 1, 2, 3 or 4;

and $R^3$ independently in each occurrence is a substituent.

10. The copolymer of claim 8 wherein the partially conjugating further repeat unit is a repeat unit of formula (VIIb) or (VIIc):

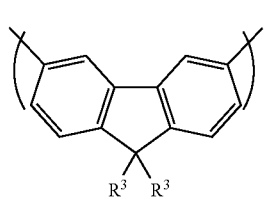

(VIIb)

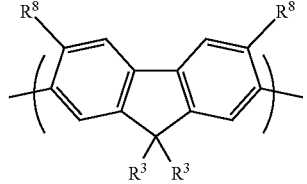

(VIIc)

wherein $R^3$ and $R^8$ independently in each occurrence is a substituent.

11. The copolymer of claim 6 wherein the repeat unit of formula (I) is not a partially-conjugating repeat unit.

12. A formulation comprising the copolymer of claim 1, and at least one solvent.

13. An organic light-emitting device comprising an anode, a cathode, a light-emitting layer between the anode and the cathode, and a hole transporting layer between the light emitting layer and the anode, wherein the hole transporting layer comprises a copolymer according to claim 1.

14. The organic light-emitting device of claim 13 wherein the light-emitting layer comprises a fluorescent light-emitting material.

15. The organic light-emitting device of claim 13 wherein the light-emitting layer comprises a phosphorescent light-emitting material.

16. A method of forming an organic light-emitting device according to claim 13 comprising the steps of: forming the hole-transporting layer over the anode; forming the light-emitting layer over the hole-transporting layer; and forming the cathode over the light-emitting layer.

17. The method according to claim 16 wherein the hole-transporting layer is formed by depositing a formulation comprising a copolymer comprising a repeat unit of Formula (I) and at least one further repeat unit, and at least one solvent over the anode; and evaporating the at least one solvent:

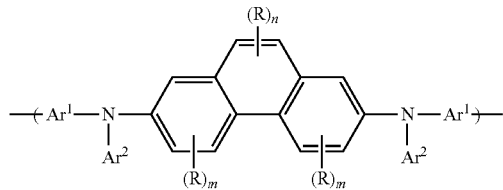

Formula (I)

wherein:

Ar¹ and Ar² are each independently selected from aryl and heteroaryl, each of which is independently unsubstituted or substituted with one or more substituents;

each R is independently a substituent;

each n is independently 0, 1 or 2;

each m is independently 0, 1, 2 or 3; and a further repeat unit is a partially conjugating repeat unit.

18. The method according to claim 17 wherein the hole-transporting layer is crosslinked prior to formation of the light-emitting layer.

19. A copolymer comprising a repeat unit of Formula (XIV) and at least one further repeat unit:

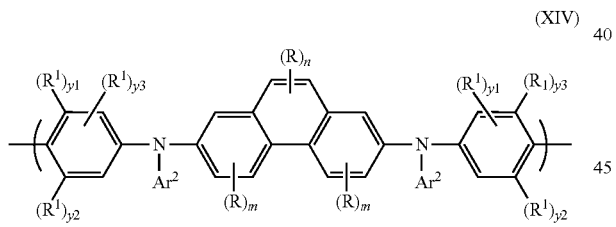

(XIV)

wherein:

each Ar² is independently aryl or heteroaryl, each of which is independently unsubstituted or substituted with one or more substituents;

each R is independently a substituent;

each n is independently 0, 1 or 2;

each m is independently 0, 1, 2 or 3;

R¹ in each occurrence is a substituent;

y1 and y2 are each independently 0 or 1 with the proviso that at least one of y1 and y2 is 1; and each y3 is independently 0, 1 or 2;

wherein the repeat unit of formula (XIV) is a partially conjugating repeat unit.

20. A copolymer comprising a repeat unit of Formula (I) and at least one further repeat unit:

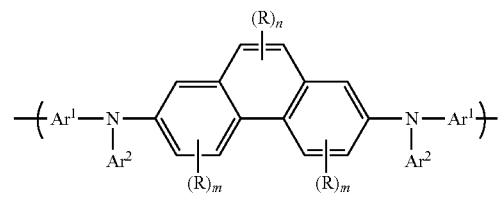

Formula (I)

wherein:

Ar¹ and Ar² are each independently aryl or heteroaryl, each of which is independently unsubstituted or substituted with one or more substituents;

each R is independently a substituent;

each n is independently 0, 1 or 2;

each m is independently 0, 1, 2 or 3, and at least one of the repeat units of the polymer is a partially conjugating repeat unit;

wherein a further repeat unit is a partially conjugating repeat unit and is a repeat unit of formula (IIIa), (IIIb) or (IIIc):

(IIIa)

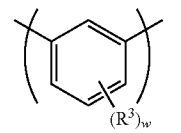

(IIIb)

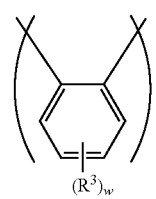

(IIIc)

wherein p is 1, 2 or 3; q in each occurrence is independently 1, 2, 3 or 4; w is 0, 1, 2, 3 or 4;

and R³ independently in each occurrence is a substituent.

21. A method of forming an organic light-emitting device comprising an anode, a cathode, a light-emitting layer between the anode and the cathode, and a hole transporting layer between the light emitting layer and the anode, wherein the hole transporting layer comprises a copolymer comprising a repeat unit of Formula (I) and at least one further repeat unit:

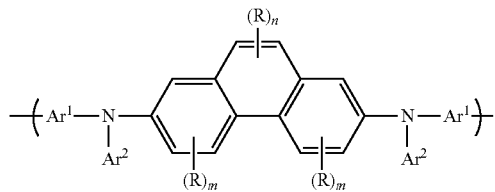

Formula (I)

wherein:
Ar$^1$ and Ar$^2$ are each independently aryl or heteroaryl, each of which is independently unsubstituted or substituted with one or more substituents;
each R is independently a substituent;
each n is independently 0, 1 or 2;
each m is independently 0, 1, 2 or 3, and at least one of the repeat units of the polymer is a partially conjugating repeat unit;
the method comprising the steps of: forming the hole-transporting layer over the anode; forming the light-emitting layer over the hole-transporting layer; and forming the cathode over the light-emitting layer;
wherein the hole-transporting layer is formed by depositing a formulation comprising the copolymer comprising a repeat unit of Formula (I) and at least one further repeat unit, and at least one solvent over the anode and evaporating the at least one solvent; and wherein the hole-transporting layer is crosslinked prior to formation of the light-emitting layer.

22. The copolymer of claim 1, wherein Ar$^2$ in each occurrence is independently selected from the group consisting of unsubstituted phenyl; phenyl substituted with one or more substituents; and a group of formula (XIII):

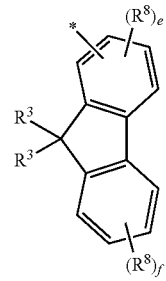

(XIII)

wherein * represents a point of attachment of the group of formula (XIII) to a N atom of the repeat unit of formula (I); R$^3$ in each occurrence is the same or different and is a substituent; R$^8$ in each occurrence is the same or different and is a substituent; e is 0, 1, 2 or 3; and f is 0, 1, 2, 3 or 4.

* * * * *